United States Patent [19]

Ballato

[11] Patent Number: 4,547,748
[45] Date of Patent: Oct. 15, 1985

[54] FREQUENCY SYNTHESIZER USING A MATRIX OF SELECTABLE PIEZOELECTRIC RESONATORS

[75] Inventor: Arthur Ballato, Long Branch, N.J.

[73] Assignee: The United States of America as represented by the Secretary of the Army, Washington, D.C.

[21] Appl. No.: 639,755

[22] Filed: Aug. 13, 1984

[51] Int. Cl.[4] ............................................. H03B 5/32
[52] U.S. Cl. .................................... 331/49; 310/320; 310/366; 331/161; 331/179
[58] Field of Search ..................... 331/49, 116 R, 161, 331/162, 179; 310/320, 365, 366; 333/187, 189, 190, 191, 192

[56] References Cited

U.S. PATENT DOCUMENTS 3,167,730 1/1965 Anderson et al. .............. 331/161 X
3,569,750 3/1971 Beaver ................................. 310/320

FOREIGN PATENT DOCUMENTS 2100950 1/1983 United Kingdom ................ 333/191

OTHER PUBLICATIONS

Dilworth, "A Channel Scanning Arrangement for Quartz Crystals", Radio Communication, vol. 53, No. 9, Sep. 1977, pp. 680-683.

*Primary Examiner*—Siegfried H. Grimm
*Attorney, Agent, or Firm*—Anthony T. Lane; Jeremiah G. Murray; Roy E. Gordon

[57] ABSTRACT

A frequency synthesizer is provided that is capable of supplying a plurality of accurate frequencies. The frequency synthesizer comprises a resonator matrix including a plurality of resonators embedded in a single monolithic piece of piezoelectric crystal. The resonators are arranged in rectangular row and column configuration including m rows and n columns. Each of the resonators is separated from its neighboring resonators by distances such that the resonant energies do not overlap. Each of the rows of resonators bears a metallic electrode stripe for that row and each of the columns of resonators bears a metallic electrode stripe for that column, the electrodes row stripes being positioned on the top surface of the crystal and the electrode column stripes being positioned on the bottom surface of the crystal. The areas of overlap of the row and column stripes are registered with the central portions of the embedded resonators. Two diode arrays are positioned on the periphery of the crystal for addressing the individual row electrode stripes and the individual column electrode stripes so that any desired resonator can be activated by connecting the stripe corresponding to its row address and the stripe corresponding to its column address to a suitable active oscillator network.

8 Claims, 5 Drawing Figures

FREQUENCY SYNTHESIZER USING A MATRIX OF SELECTABLE PIEZOELECTRIC RESONATORS

The invention described herein may be manufactured, used, and licensed by or for the Government for governmental purposes without the payment to me of any royalty thereon.

This invention relates in general to frequency synthesizers for frequency selection and control, and in particular, to frequency synthesizers using bulk acoustic waves (BAWs).

BACKGROUND OF THE INVENTION

Heretofore, surface acoustic waves (SAWs) have been used for frequency synthesizers over BAWs due to their frequency tuning capability. That is, in general, SAWs can be "pulled" in frequency further than BAW resonators. Because of this, they are preferred sources for FM, FSK, and spread-spectrum operations. For FFH (fast frequency hopping) synthesizers, they are also used for the same reason. SAWs are deficient however in their noise properties and stability close to the carrier frequency.

SUMMARY OF THE INVENTION

The general object of this invention is to provide a frequency synthesizer capable of supplying a plurality of accurate frequencies. A more specific object of the invention is to provide such a frequency sythesizer that can be used for $C^3I$ systems and spread-spectrum systems using FFH synthesizers. Another object of the invention is to provide such a frequency synthesizer that uses bulk acoustic waves instead of surface acoustic waves because of their superior noise properties.

It has now been found that the aforementioned objects can be obtained by providing a frequency synthesizer including a resonator matrix comprised of a matrix of elements incorporated in a single monolithic piece of piezoelectric crystal as, for example, quartz. More specifically, the frequency synthesizer according to the invention includes a resonator matrix comprised of a plurality of resonators embedded in a single monolithic piece of piezoelectric crystal. The resonators are arranged in a rectangular row and column configuration, including m rows and n columns, with each of the resonators being separated from its neighboring resonators by such a distance that the resonant energies do not overlap. Each of the rows of resonators bears a metallic electrode stripe for that row and each of the columns of resonators bears a metallic electrode stripe for that column. The electrode row stripes are positioned on the top surface of the crystal and the electrode column stripes are positioned on the bottom surface of the crystal. The areas of overlap of the rows stripes and column stripes are registered with the central portions of the embedded resonators. Two diode arrays are positioned on the periphery of the crystal for addressing the individual row electrode stripes and the individual column electrode stripes so that any desired resonator can be activated by connecting the stripe corresponding to its row address and the stripe corresponding to its column address to a suitable active oscillator network.

DESCRIPTION OF THE DRAWINGS

Referring to FIG. 1, a resonator matrix 10 includes a plurality of resonators on a single piece of quartz crystal 12. The resonators are slightly offset in frequency, f, one resonator for each frequency needed. Each resonator includes a circular, square, or rectangular membrane that has been etched or otherwise cut into the single piece of quartz crystal 12 by methods well recognized in the art. These include photolithography, chemical or ion etching, chemical polishing, etc. Each membrane is slightly different in thickness so as to generate frequencies designated $f_{11}$ to $f_{mn}$, where the subscripts m and n indicate the respective row and column number of the resonator. The resonators are arranged in a rectangular row and column configuration including m rows and n columns with each of the resonators being separated from its neighboring resonators by such a distance that the resonant energies do not overlap.

Referring to FIG. 2, each of the rows of resonators as shown in FIG. 1 bears a metallic electrode stripe 16, 18, and 20 for that row. Each of the columns of resonators bears a metallic electrode stripe 22, 24, and 26 for that column. The electrode row stripes 16, 18 and 20 are positioned on the top surface of the crystal, and the electrode column stripes 22, 24, 26 are positioned on the bottom surface of the crystal. The areas of overlap of the row stripes and the column stripes are registered with the central portions of the embedded resonators.

Referring to FIG. 3, two diode arrays 28 and 30 are positioned on the periphery of the crystal 12 for addressing the individual row electrode stripes 16, 18, and 20 and the individual column electrode stripes 22, 24, and 26 so that any desired resonator can be activated by connecting the stripe corresponding to its row address and the stripe corresponding to its column address to diode arrays 28, 30. To address the resonator having frequency $f_{21}$, for example, the second electrode stripe, in the rows would be used, along with the first electrode stripe in the columns, and the oscillator voltage connected between these. Diode switches pick which row and which column stripes are chosen. For FFH synthesizer use, one may want to use a multiplicity of $f_{mn}$ frequencies, and combine in an ADM (add, divide and mix) circuit.

Referring to FIG. 4, the crystal, 12, is seen to be etched to form a plurality of thin membrane regions whose thicknesses are such as to produce frequencies $f_{mn}$; $f_{m'n+1}$; $f_{m'n+2}$ etc. The membrane regions are separated from each other by discontinuity regions whose cross sectional outline may be trapezoidal as shown or rectangular, wherein the bevel regions are vertical, or some other cross sectional shape as would be known in the art. Though the figure shows the thin membranes to be flush with the bottom of the crystal, 12, such a configuration is not essential. For example, the thin membranes can be formed by etching the crystal, 12 from both the top and bottom in which case the membrane would be recessed from both surfaces. The discontinuity regions provide structural support for the thin membranes. The thin plate resonator membranes 14 are separated from neighboring resonator membranes by such a distance that the resonant energies do not overlap when the resonator membranes are electroded according to well known energy trapping considerations. Such considerations are set forth in the Journal of the Acoustical Society of America, Vol. 41, pages 981 to 993, 1967 by W. Shockley et al.

Figure 1:
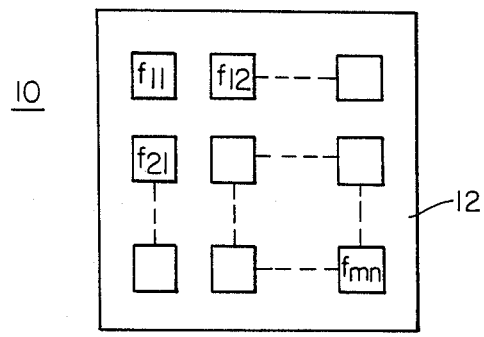
FIG. 1 is a plan view of a resonator matrix according to the invention and including a plurality of resonators embedded in a single monolithic piece of piezoelectric crystal.
Figure 2:
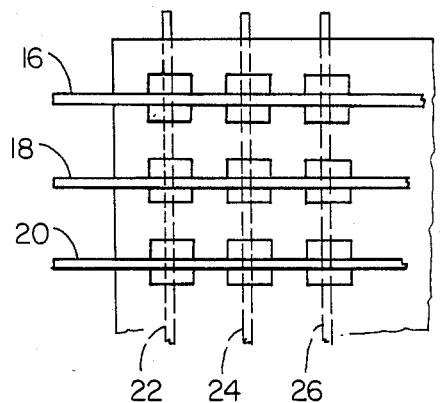
FIG. 2 is a plan view of a portion of the resonator matrix of FIG. 1 with an electroding arrangement for the resonator matrix.
Figure 3:
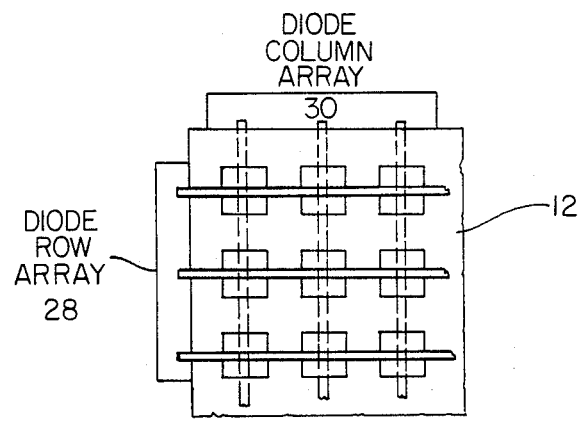
FIG. 3 is a plan view of the resonator matrix of FIG. 1 with the electroding arrangement of FIG. 2 and with the two diode arrays for addressing individual row electrode stripes and individual column electrode stripes.
Figure 4:
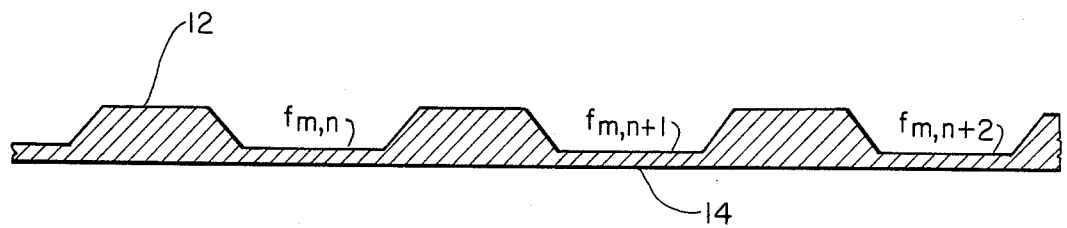
FIG. 4 is a cross sectional view of the unelectroded resonator matrix across the centers of the resonators in row m.

An alternate embodiment for the electroding arrangement in FIG. 2 is the use of bus bars for the top and bottom electrode stripes. The stripes are located along the discontinuity regions and have metallic widths and thicknesses such as to be characterized by negligible resistivity. From these bus bars, perpendicular projections can be made to provide the normal keyhole shaped, energy trapped electrodes overlapping in the thin membrane regions of each resonator. The upper bus bars are positioned horizontally along the rows; and the lower bus bars are positioned vertically along the columns. From the upper horizontal bus bars, the electrode projections to the centers of the membranes are vertical, and from the lower vertical bus bars, the electrode projections to the centers of the membranes are horizontal. The use of bus bars is especially advantageous when the energy trapping rules demand thin, narrow electrodes on the membranes. If the thin narrow electrodes were realized as in FIG. 2 for example, the resistance of the matrix would be excessive.

Figure 5:
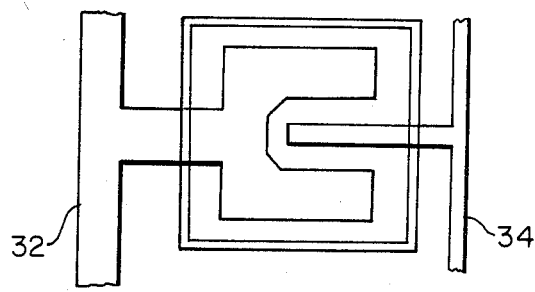
FIG. 5 is a plan view of an alternative electroding arrangement for a single resonator for rapid energization.

Referring to FIG. 5, a particular embodiment of the foregoing bus bar electroding arrangement is shown for a single resonator of the matrix. In this instance, two reference pairs of bus bar electrodes are used, a main electrode bus bar, 32, and an auxiliary electrode bus bar, 34. A complementary electroding arrangement not shown in the drawing, is positioned on the opposite surface of the crystal, 12 from the reference electrode arrangement. The complementary electroding arrangement is so positioned that the main and auxiliary bus bars are horizontal, and the electrode projections, overlapping in the central portion of the membrane, are vertical. The complete complementary electroding arrangement for the entire resonator matrix is formed by a 90° rotation about the thickness of the crystal, 12 with respect to the reference electrode arrangement. In certain practical situations such as FFH synthesizers, it is required that the different resonators be energized rapidly. If the resonators are required to build up to full vibrational amplitude from a quiescent state, too much time may be consumed, or the oscillations may not have the correct phase. The arrangement of FIG. 5 obviates this problem. The auxiliary electrode pair keeps the resonator in a vibratory state. When addressed by the main electrodes pairs, a diode disconnects the auxiliary electrode as the main electrode pairs take over.

In the foregoing description, the necessary energy trapping required for non-frequency interference between the resonators is realized solely by the placement of the electrode pairs that overlap in the central regions of the thin flat membrane resonators. The spacing of the resonators may be reduced and additional resonators accommodated in the matrix on a crystal, 12, by configuring the individual resonator membranes to have plano convex, or biconvex lens shapes in their central regions, where the electrode pairs overlap. Methods for producing such lens shapes by chemical or ion etching are known in the art.

A TABLE presenting typical energy trapped plano convex designs for quartz plate of AT cut and SC cut is included. In the TABLE, curvatures are specified in diopters for the lens shaped regions of the membranes, and nominal resonator frequencies are set forth in megahertz. For nominal frequencies between those given, a simple interpolation may be made for the diopter.

| $f_o$ (MHz) | Diopter AT | SC |
|---|---|---|
| 100 | .23 | .21 |
| 120 | .27 | .25 |
| 150 | .34 | .31 |
| 200 | .45 | .41 |
| 220 | .50 | .46 |
| 250 | .56 | .52 |
| 300 | .67 | .62 |
| 500 | 1.1 | 1.0 |
| 1000 | 2.3 | 2.1 |

I wish it to be understood that I do not desire to be limited to the exact details as described for obvious modifications will occur to a person skilled in the art.

What is claimed is:

1. A frequency synthesizer comprising a resonator matrix including a plurality of resonators embedded in a single monolithic piece of piezoelectric crystal, said resonators being arranged in rectangular row and column configuration including m rows and n columns, each of said resonators being separated from its neighboring resonators by distances such that the resonant energies do not overlap, each of said rows of resonators bearing a metallic electrode stripe for that row and each of said columns of resonators bearing a metallic electrode stripe for that column, said electrode row stripes being positioned on the top surface of the crystal, said electrode column stripes being positioned on the bottom surface of the crystal and wherein the areas of overlap of said row and column stripes are registered with the central portions of the embedded resonators, two diode arrays positioned on the periphery of the crystal for addressing the individual row electrode stripes and the individual column electrode stripes so that any desired resonator can be activated by connecting the stripe corresponding to its row address and the stripe corresponding to its column address to a suitable active oscillator network.

2. A frequency synthesizer according to claim 1 wherein the distance between neighboring resonators is determined according to energy trapping rules.

3. A frequency synthesizer according to claim 1 wherein the piezoelectric crystal is a quartz crystal.

4. A frequency synthesizer according to claim 2 wherein bus bars are used for the top and bottom electrode stripes, the bus bars having metallic widths and thicknesses such as to be characterized by negligible resistivity.

5. A frequency synthesizer according to claim 4 wherein perpendicular projections are made from the bus bars to provide the normal keyhole shaped, energy trapped electrodes overlapping in the thin membrane regions of each resonator.

6. A frequency synthesizer according to claim 5 wherein two reference pairs of bus bar electrodes are used, a main electrode bus bar, and an auxiliary electrode bus bar, a complementary electroding arrangement being so positioned on the opposite surface of the crystal that the main and auxiliary bus bars are horizontal, and the electrode projections, overlapping in the central portion of the membrane, are vertical.

7. A frequency synthesizer according to claim 6 where the complete complementary electroding arrangement for the entire resonator matrix is formed by a 90° rotation about the thickness of the crystal with respect to the reference electrode arrangement.

8. A frequency synthesizer according to claim 1 wherein the spacing of the resonators is reduced and additional resonators accommodated by configuring the individual resonator membranes to have plano convex or biconvex lens shapes in their central regions when the electrode pairs overlap.

* * * * *